United States Patent

Carter

[15] 3,660,728

[45] May 2, 1972

[54] APPARATUS FOR SELECTIVELY INTERCONNECTING THE CONDUCTORS OF A PLURALITY OF MULTI-CONDUCTOR CABLES

[72] Inventor: Clyde Thomas Carter, Mechanicsburg, Pa.

[73] Assignee: AMP Incorporated, Harrisburg, Pa.

[22] Filed: Sept. 30, 1970

[21] Appl. No.: 76,720

[52] U.S. Cl. ....................317/118, 317/101 CC

[51] Int. Cl. ....................H05k 7/10, H02b 1/20

[58] Field of Search ....................174/59; 317/101 C, 101 CC, 317/101 D, 117, 118, 112

[56] References Cited

UNITED STATES PATENTS

| | | | |
|---|---|---|---|
| 3,533,045 | 10/1970 | Henschen | 317/101 CC |
| 3,478,251 | 11/1969 | Perotto | 317/101 CC |
| 3,568,001 | 3/1971 | Straus | 317/101 D |

*Primary Examiner*—Laramie E. Askin
*Assistant Examiner*—Gerald P. Tolin
*Attorney*—Curtis, Morris and Safford, William J. Keating, Ronald D. Grefe, William Hintze, Adrian J. La Rue, Frederick W. Raring, Jay L. Seitchik and John P. Vandenburg

[57] ABSTRACT

A system for selectively interconnecting the conductors of a plurality of multi-conductor cables, comprising a pair of printed circuit boards disposed in substantially parallel, spaced apart relationship, one side of each of the boards having conductors thereon which extend to the edge portions thereof. The multi-conductor cables have connectors on the ends thereof which are connected to the edge portions of the boards so that the conductors in the cables are electrically connected to the conductors on the boards. A plurality of terminal junction modules are mounted on the other sides of the boards and have contact terminals extending through the boards and electrically connected to the conductors on the boards. Interconnection conductors having contact terminals on their ends are selectively mated with the terminals of the junction modules to thereby selectively interconnect the cable conductors. One of the boards has openings therein through which the modules mounted on the other board extend so that all of the modules are accessible from one side of the boards.

18 Claims, 6 Drawing Figures

Patented May 2, 1972 3,660,728

4 Sheets-Sheet 1

Patented May 2, 1972

3,660,728

4 Sheets-Sheet 3

APPARATUS FOR SELECTIVELY INTERCONNECTING THE CONDUCTORS OF A PLURALITY OF MULTI-CONDUCTOR CABLES

BACKGROUND OF THE INVENTION

This invention relates to an interconnection system and, more particularly, to such a system for selectively connecting the conductors of a plurality of multi-conductor cables.

Electrical systems often consist of a large number of wire conductors which are generally arranged in parallel relation and are covered by flexible insulation to define a multi-conductor cable. In practice, it is often necessary to interconnect the conductors of a plurality of such multi-conductor cables. The interconnection systems previously utilized for this purpose have been relatively bulky and/or heavy, and have been so constructed that it has been very difficult to repair or change the connections between the conductors of such multi-conductor cables. In addition, many of the prior art interconnection systems have not been environmentally sealable.

Accordingly, a need has arisen for an interconnection system for multi-conductor cables which is compact and simple in construction, environmentally sealable, and which can be utilized to easily and quickly selectively interconnect the conductors of such multi-conductor cables.

SUMMARY OF THE INVENTION

It is an object of the present invention to provide a new and improved system for selectively interconnecting the conductors of a plurality of multi-conductor cables, which system is not subject to the disadvantages of the prior art systems. Another object is to provide such an interconnection system which is simple in construction and which can be easily utilized for the purpose of interconnecting selectively the conductors of a plurality of multi-conductor cables. A further object is the provision of such a selective interconnection system wherein circuit boards and terminal junction modules are utilized in a manner to provide a compact and easily modified interconnection system. A still further object is to provide such an interconnection system which can be environmentally sealed.

These and other objects of the invention are achieved in a preferred embodiment of the invention wherein a system for selectively interconnecting the conductors of a plurality of multi-conductor cables comprises a pair of printed circuit boards disposed in substantially paralle, spaced apart relationship in a junction box. One side of each of the circuit boards has conductors thereon which extend to edge portions of the boards. The multi-conductor cables extending into the junction box have connectors on the ends thereof which are connected to the boards so as to electrically connect the conductors in the cables to the conductors on the boards. Terminal junction modules are mounted on the other sides of the circuit boards, and have contact terminals therein with portions extending through the board on which each module is mounted and being electrically connected to the conductors on the circuit boards. Interconnection conductors have contact terminals on their ends which are selectively mated with the contact terminals of the junction modules so as to selectively interconnect the conductors of the multi-conductor cables.

One of the circuit boards is provided with a plurality of openings therethrough for the purpose of accommodating terminal junction modules mounted on the other board. In this manner, all of the modules are accessible from one side of the junction box, and thus can be easily, selectively interconnected.

Each of the junction modules is provided with a plurality of contact terminals which may be electrically connected in any desired manner so as to provide for any type of interconnection of the conductors of the multi-conductor cables within the junction box. In the herein disclosed embodiment, the entire junction box is environmentally sealed to permit use at high altitudes and to exclude undesirable gases or moisture.

BRIEF DESCRIPTION OF THE DRAWINGS

FIG. 3 is a bottom plan view of an embodiment of a circuit board which can be utilized in the interconnection system of the present invention;

DESCRIPTION OF THE PREFERRED EMBODIMENT

Figures 1, 2:
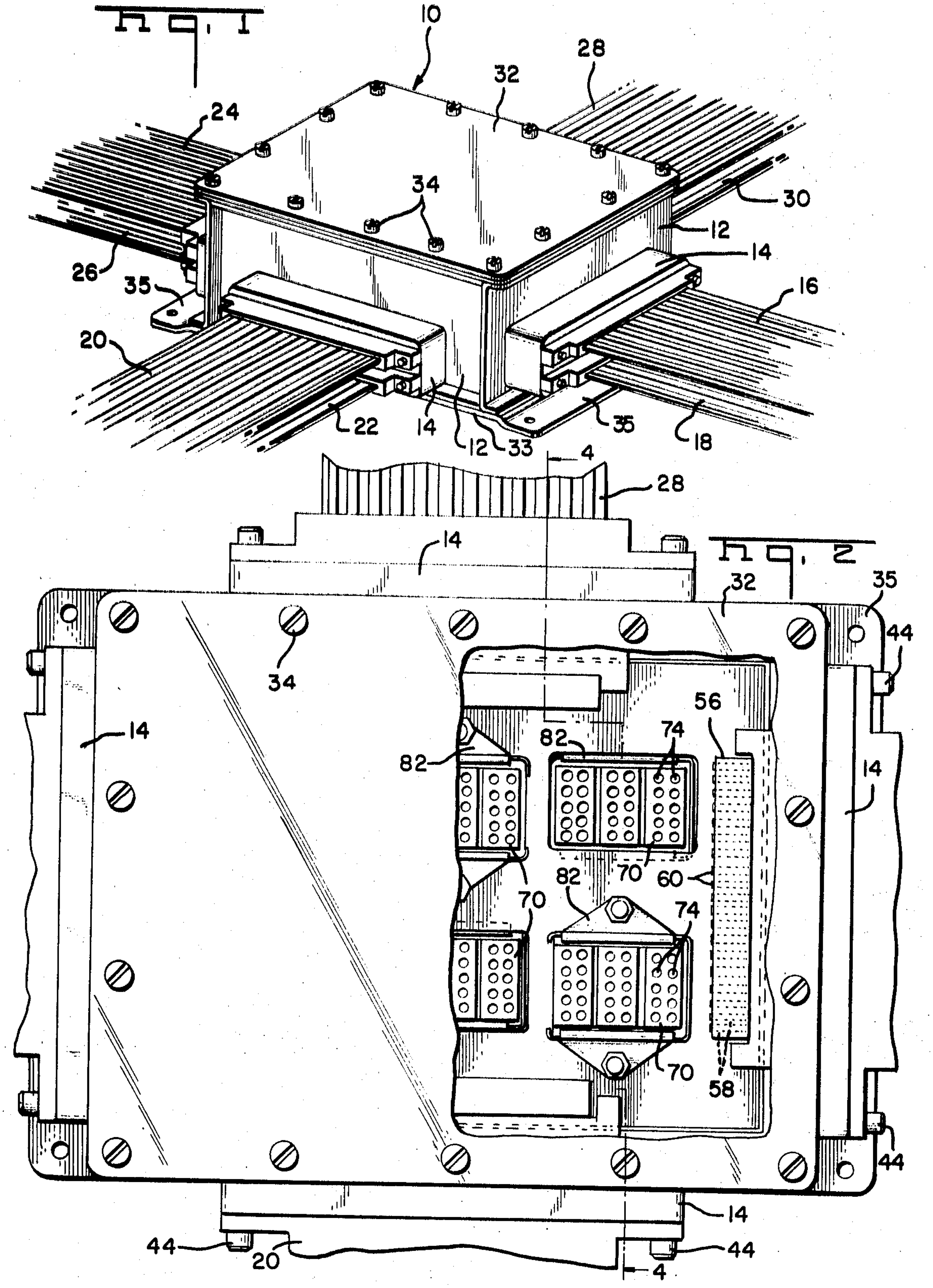
FIG. 1 is a perspective view of a junction box for the interconnection system of the present invention, showing a series of eight multi-conductor cables extending into the junction box.
FIG. 2 is an enlarged top plan view of the junction box shown in FIG. 1, with the cover of the box broken away to expose a portion of the interior thereof.
Figure 2:
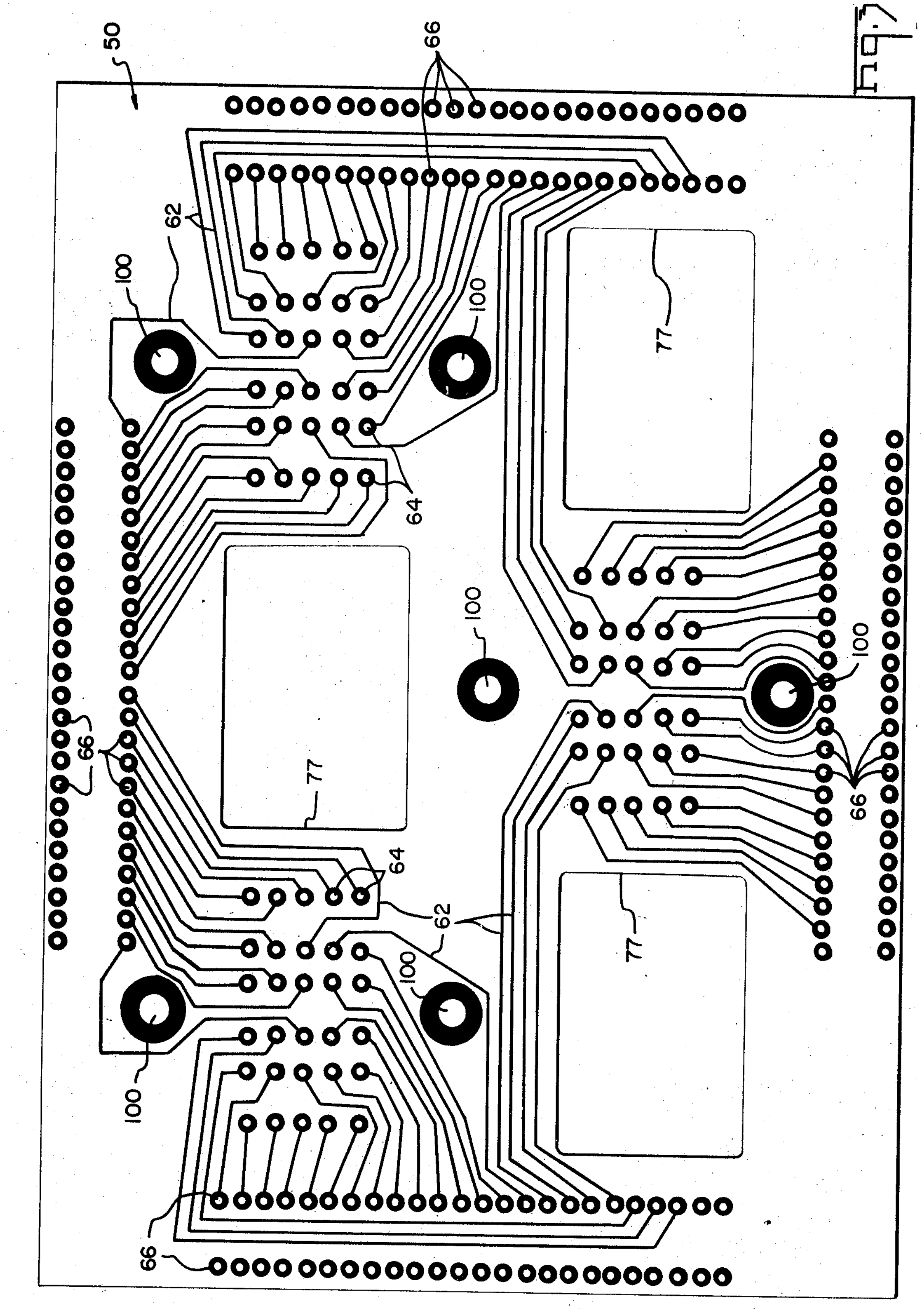

FIG. 1 illustrates a junction box 10 for the interconnection system of the present invention. The side walls 12 of the junction box 10 are provided with receptacles 14 for receiving the ends of sealed multi-conductor cable connectors 16, 18, 20, 22, 24, 26, 28 and 30 which are selectively interconnected within the junction box. The connectors 16–30 may be of any suitable construction, such as that disclosed in U.S. Pat. application Ser. No. 879,451, filed on Nov. 24, 1969. The junction box 10 is provided with a cover 32 which is adapted to be removably and sealingly mounted in any suitable manner on the side walls 12 and to be retained thereon by a plurality of screws 34 that extend through apertures in the cover 32 and are threadably received within holes in flanges at the upper ends of the side walls 12. A bottom wall 33 is secured to the side walls 32 and has a pair of apertued mounting flange portions 35 for the purpose of enabling the junction box to be mounted on a suitable support (not shown).

It is noted that the junction box may be of any suitable construction other than that disclosed herein within the scope of the present invention, and that the cover 32 may be retained thereon in any suitable manner other than by the screws 34.

Figure 4:
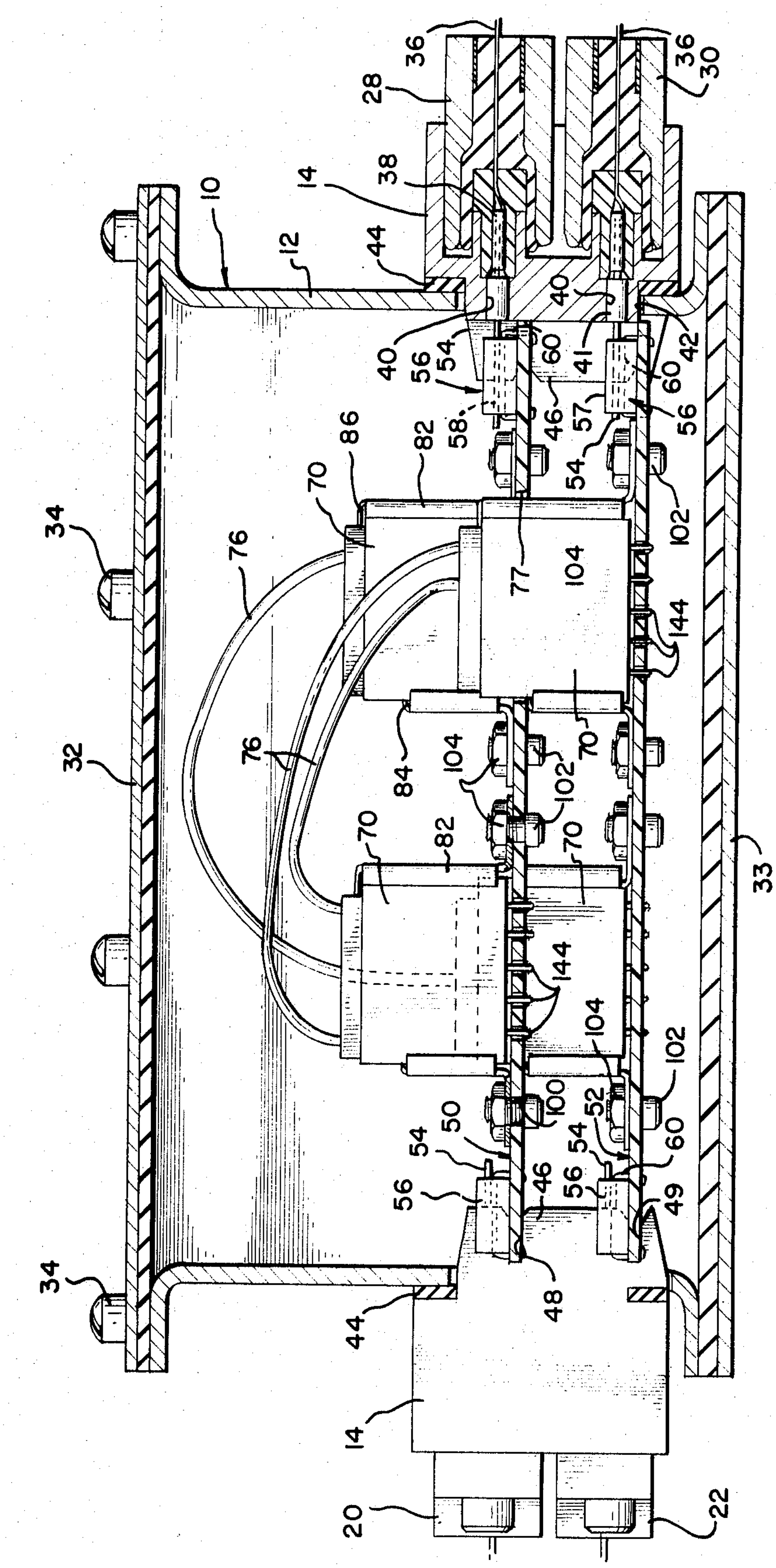
FIG. 4 is an enlarged sectional view of the junction box and interconnection system taken substantially along line 4—4 in FIG. 2.

As shown in FIG. 4, each of the conductors 36 of the cable connectors 16 through 30 are connected at their inner ends to terminals 38 which are receivable within complementary bores 40 in the receptacles 14. Each of the receptacles 14 is provided with two sets of horizontally aligned bores 40 for the purpose of accommodating insulating bushings 41 and the terminals 38 for each of the conductors 36 of the multi-conductor cables 16 through 30. Pins 54 are mounted in the bushings 41 and are received at their outer ends within the terminals 38. The receptacles 14 extend through apertures 42 in the side walls 12 of the junction box 10 and are retained on the side walls in any suitable manner, such as by the screw connections 44 shown in FIG. 2. Seals 44 are provided between each receptacle 14 and the adjacent side wall 12 for the purpose of sealing the apertures 42 in the side walls.

Each of the receptacles 14 is provided with inwardly extending portions 46 having substantially horizontally extending, vertically spaced slots 48 and 49 therein. The upper circuit board 50 is thus supported in the upper slots 48 of the inwardly extending receptacle portions 46, and the lower board 52, which is parallel to the upper board 50, is supported in the lower slots 49 in the inwardly extending receptacle portions 46. It will be seen, therefore, that the circuit boards 50 and 52 are supported within the junction box 10 by the receptacles 14, and can be easily removed from the junction box by merely removing the receptacles 14 from the side walls 12.

As shown in FIGS. 2 and 4, the inner ends of the pins 54 are received within sockets in connector block or pin receptacle 56. Each of the pin receptacles 56 comprises a housing 57 of inslulating material that is provided with a number of substantially parallel, transversely extending sockets 58 which are adapted to slidably receive the connecting pins 54. A flexible wire member 60 extends through each of the sockets 58 and has its outer end portions bent downwardly for connection to the conductors of the adjacent circuit board 50 or 52 in a manner to be described hereinafter. An example of a suitable pin receptacle construction is disclosed in U.S. Pat. No. 3,439,316 (FIG. 8). Alternatively, the pin receptacles 56 could be omitted and the conductors 36 of the multi-conductor cable connectors 16 through 30 could be connected to edge connectors (not shown) on the circuit boards 50, 52.

Each of the circuit boards 50, 52 is provided with a plurality of conductors 62 on the lower side thereof, which may be arranged in any desired manner, such as that shown in FIG. 3 which illustrates the lower side of the circuit board 50. The circuit boards 50 and 52 which may be of the same, similar or different construction, may be of any suitable or conventional construction within the scope of this invention. All of the conductors 62 extend from inner apertured terminal portions 64 to outer apertured terminal portions 66 at the edge portions of the board 50 or 52. Any suitable number of conductors 62 and terminal portions 64 and 66 may be provided on the circuit boards 50 or 52 in any desired relation.

Referring again to FIG. 4, the wire members 60 of each of the pin receptacles 56 extend downwardly through the apertured terminal portions 66 on the underside of each of the circuit boards 50 and 52. At their lower ends, the wire members 60 are bent inwardly into electrical contact with the terminal portions 66 and are soldered thereto to thereby serve to retain the pin receptacles 56 on the circuit boards. In this manner, the sockets 58 of each of the pin receptacles 56, and thus the connecting pins 54 received therein, are electrically connected to the conductors on the circuit boards 50 and 52. It will be seen, therefore, that the pin receptacles 56 serve to electrically connect the conductors 36 of the multi-conductor cable connectors 16 through 30 to the conductors 62 of the circuit boards 50 and 52.

Figures 5, 6:
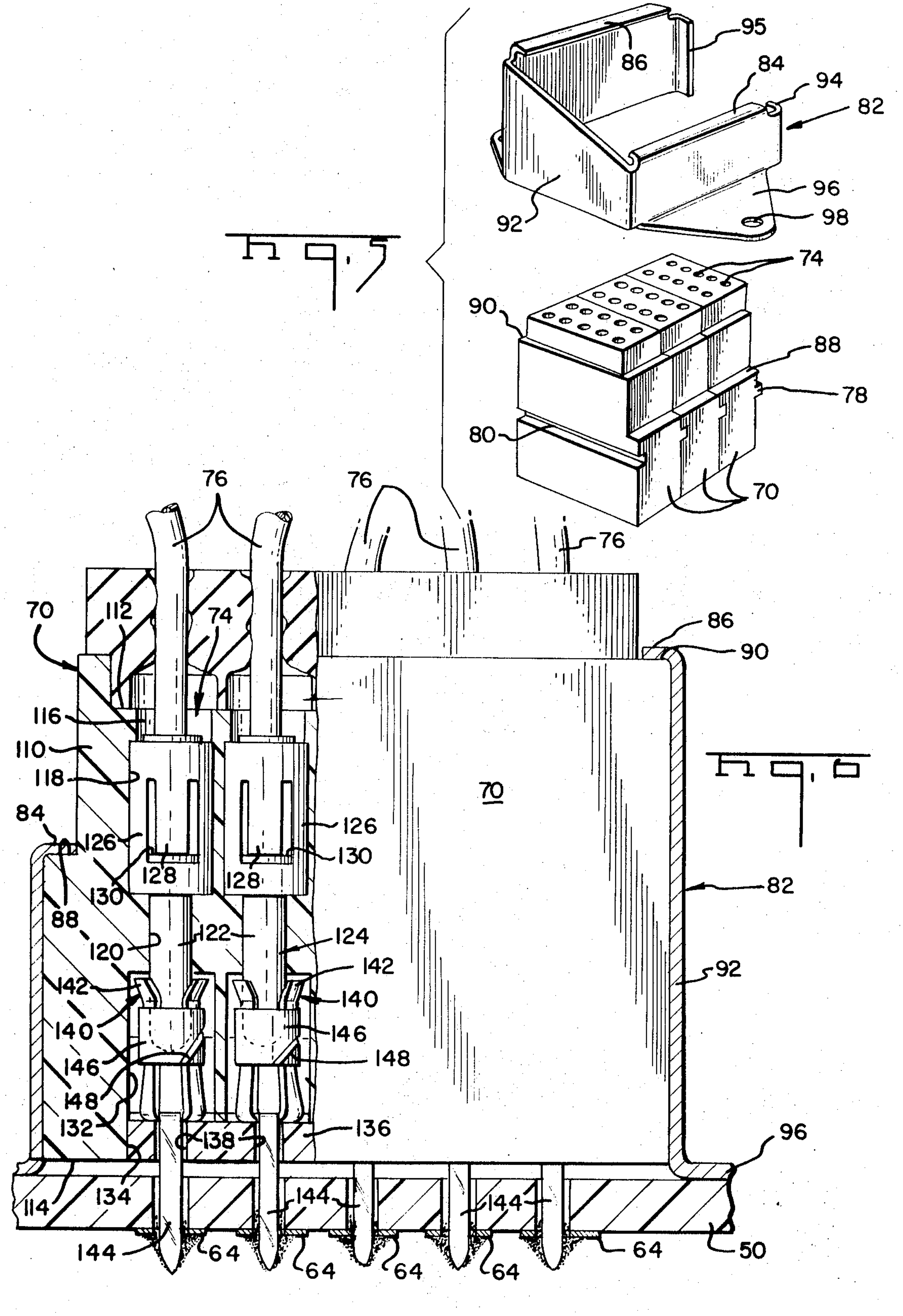
FIG. 5 is an enlarged, exploded view in perspective of a plurality of terminal junction modules of the present interconnection system and of a support bracket for the modules.
FIG. 6 is an enlarged elevational view, partly in section, of a terminal junction module, showing the connection between its contact terminals and those of the interconnection conductors, and further showing the connection of the terminals of the junction modules to the conductors on the circuit board on which it is mounted.

In order to selectively interconnect the conductors 36 of the multiconductor cable connectors 16 through 30, a plurality of terminal junction modules 70 are mounted on and electrically connected to the conductors of the circuit boards 50 and 52. As shown in FIGS. 2, 4 and 5, each of the junction modules 70 is provided with a plurality of sockets 74 which are adapted to receive the ends of interconnection conductors 76 which extend between the modules 70 for the purpose of electrically connecting them. Each of the sockets 74 is electrically connected, in a manner to be described hereinafter, to one of the apertured terminal portions 64 on the circuit board 50 or 52. The number of sockets 74, therefore, corresponds to the number and location of the apertured terminal portions 64 on the circuit boards.

By utilizing a selected pattern of conductors 62 on the circuit boards 50 and 52, by electrically connecting the sockets 74 of each module 70 in a desired manner, and by electrically connecting the different modules 70 with the interconnection conductors 76 in a desired manner, the conductors 36 of the multi-conductor cable connectors 16 through 30 may be electrically connected in any desired manner, and these connections may be varied by merely connecting the conductors 76 in a different manner to the sockets 74 of the modules 70.

The upper circuit board 50 is provided with a plurality of openings 77, as shown in FIGS. 3 and 4, for the purpose of accommodating the modules 70 mounted on the lower circuit board 52. In this manner, all of the modules 70 are accessible from the upper end of the junction box 10. If the circuit boards 50 and 52 are of identical construction, the lower board 52 would be reversed end-for-end with respect to the upper board 50 so that its openings would not be in alignment with the openings 77 in the upper board 50.

Referring now to FIGS. 4 to 6, the construction of the modules 70, their mounting on the circuit boards 50 and 52, and the cooperation between the conductors 76 and the modules 70, will be more specifically described. Each of the modules 70 preferably is of identical construction and they are adapted to be disposed in mating, interlocking engagement by the provision of a tongue 78 on each module which is receivable within a groove 80 in an adjacent module (see FIG. 5). A plurality of interlocked modules 70 are retainably mounted on the circuit boards 50 and 52 by support brackets 82 that are provided with flanges 84 and 86 at the upper ends thereof for the purpose of engaging recessed portions 88 and 90, respectively, on the modules 70 to retain them on the circuit boards. Each bracket 82 is provided with a U-shaped side wall 92 which terminates in a pair of inwardly extending flanges 94, 95 for the purpose of preventing the modules 70 from being removed laterally from the bracket 82. On opposite sides of the side wall 92 there are provided mounting flanges 96 having apertures 98 therein that are adapted to mate with corresponding apertures 100 in the circuit boards 50 and 52. Threaded bolts 102 are received in the apertures 98 and 100, and nuts 104 are threaded onto the ends of the bolts for the purpose of removably retaining the brackets 82, and the modules 70 contained therein, on the circuit boards 50 and 52.

It is noted that the brackets 82 may be of any suitable construction other than that shown and described herein, and that any desired number of modules 70 may be mounted in the brackets 82. The size of the brackets 82, and thus the number of modules mounted therein, is determined by the number and arrangement of sockets 74 in the modules 70 which correspond to the number and arrangement of the apertured terminal portions 64 in the circuit boards 50 and 52.

Referring specifically to FIG. 6, as an illustrative example, each of the modules 70 contains two parallel rows of five sockets 74 (see FIG. 5) which correspond in number and arrangement to the adjacent apertured terminal portions 64 on the adjacent circuit board 50 or 52. In practice, all of the sockets 74 might be electrically commoned with each other so that all of the conductors 76 inserted into the module would be commonly connected. Alternatively, the modules 70 might contain two groups of commonly connected sockets 74, one group comprising six sockets and the other group comprising four sockets, so that six conductors 76 could be commonly connected in one section of the module and four conductors 76 could be commonly connected in another section of the module. Within the scope of this invention, the sockets 74 of each module 70 may be connected in any suitable or desired manner.

Each module 70 comprises a body portion 110 of epoxy resin or other suitable moldable material having the sockets 74 extending from its upper end 112 to its lower end 114. Each socket 74 has an entrance portion 116 which communicates with an enlarged cylindrical chamber 118, which in turn communicates a constricted neck portion 120, the diameter of which is slightly greater than the contact tip section 122 of the contact pins 124 secured to the ends of each of the interconnection conductors 76. A retaining member 126 is mounted in each chamber 118 for the purpose of removably retaining an inserted contact pin 124 in the module socket 74. The construction of the retaining member 126 and its cooperation with the contact pin 124 is fully described in pending U.S. Pat. application, Ser. No. 801,436, filed Feb. 24, 1969. Briefly, the retaining member 126 is provided with inwardly and downwardly directed lances 128 on its opposite sides which are adapted to engage behind a rearwardly facing shoulder 130 on the contact pin 124 to prevent accidental removal of the pin 124 from the socket 74. Intentional removal of the contact pin 124 from the socket 74 can be effected by a tool in a manner described in the above-identified pending patent application.

The constricted neck portion 120 in the socket 74 opens into a relatively short, large diameter section 132 which in turn extends into a recess 134 at the lower end 114 of the body portion 110. The bottom end of the body portion 110 is closed by a suitable base plate 136 which is secured to the body portion 110 in any suitable manner and which has two rows of apertures 138 therein that are disposed in alignment with the sockets 74 in the body portion 110. A contact socket 140 is positioned within the large diameter section 132 of each module socket 74. Each contact socket 140 comprises four flexible contact arms 142 which are arranged in equally spaced angular intervals around the socket axis. The upper end portion of each arm 142 is outwardly directed to provide a lead-in surface for the contact pin 124 during insertion. The lower ends of the contact arms 142 are connected to a connecting pin 144 which extends downwardly through the aperture 138 in the base plate 136 and through the subadjacent apertured terminal portion 64 in the adjacent circuit board 50 or 52. The lower end of each connecting pin 144 is soldered in any suitable manner to the terminal portions 64 on the adjacent circuit board 50 or 52 to electrically connect the pins 144 with the conductors 62 on the adjacent circuit board.

The intermediate portions of the contact arms 142 are surrounded by a cylindrical spring 146 having an open spiral seam 148. The spring 146 functions to protect the contact arms 142 and to resiliently urge their inner surfaces against the surface of an inserted pin 124, as shown in FIG. 6.

A sealing block 150 of relatively soft compressible material such as silicone rubber may be bonded to the upper end 112 of the module body portion 110. The sealing block 150 has openings 152 extending therethrough in alignment with the sockets 74, the openings 152 being constricted along at least part of their lengths as shown at 154 so that after a contact pin 124 and conductor 76 are forced through an individual opening 152, the partially compressed side walls adjacent to the opening will bear against the wire as shown in FIG. 6 to seal the socket 74 and the inserted contact pin 124 from the atmosphere.

The specific constructions of and cooperation between each module 70 and the contact pins 124 of the interconnection conductors 76 are specifically shown and described in the above-identified pending patent application. It is noted, however, that any suitable type of module and contact pin construction could be utilized to connect the interconnection conductors 76 to the circuit board conductors 62 within the scope of this invention.

From the foregoing description, it will be readily seen that the present invention provides a simple, compact and environmentally sealed interconnection system for selectively connecting t e conductors of multi-conductor cables. It is noted that, within the scope of the present invention, the junction box 10, the receptacles 14, the pin receptacles 56, the circuit boards 50 and 52, the modules 70 and support brackets 82 therefor, and the interconnection conductors 76 and contact pins 124 therefor, may be of any suitable, conventional or desired construction.

Changes in construction will occur to those skilled in the art and various apparently different modifications and embodiments may be made without departing from the scope of the invention. The matter set forth in the foregoing description and accompanying drawings is offered by way of illustration only.

I claim:

1. In combination, a plurality of multi-conductor cables having conductors, and apparatus for selectively interconnecting said conductors, said apparatus comprising:
a printed circuit board having conductors on one side thereof,
said conductors of said cables being electrically connected to said conductors on said board,
terminal junction modules mounted on the other side of said board, said terminal junction modules having first contact terminals therein, said contact terminals in each module having portions extending through said board and being electrically connected to said conductors on said board, and
interconnection conductors having second contact terminals on their ends, said second terminals being selectively mated with said first terminals, thereby to selectively interconnect the conductors of said cables.

2. The apparatus of claim 1 wherein said conductors on said circuit board extend to the edge portions thereof, and said cables have circuit board edge portion connectors on the ends thereof to connect said cable conductors with said board conductors.

3. The apparatus of claim 1 wherein a second printed circuit board is disposed in substantially parallel spaced apart relationship with said first-mentioned circuit board, said second circuit board having conductors on one side thereof that faces in the same direction as said one side of said first-mentioned circuit board, the conductors of said cables being electrically connected to the conductors of said circuit boards, and said terminal junction modules being mounted on the other sides of said first-mentioned and said second circuit boards with said first contact terminals having portions extending through the board on which each module is mounted and being electrically connected to said conductors on said board.

4. The apparatus of claim 3 wherein one of said boards has openings therein through which the modules mounted on the other board can extend, whereby all of said moldules are accessible from one direction.

5. The apparatus of claim 4 wherein said opening means comprises a plurality of openings through said one board which accommodate modules mounted on the other board.

6. In combination a plurality of multi-conductor cables having conductors, and apparatus for selectively interconnecting said conductors, said apparatus comprising:
first and second printed circuit boards disposed in substantially parallel spaced-apart relationship,
one side of each of said boards having conductors thereon, said conductors extending to the edge portions of said boards, said sides facing in the same direction,
said cables having printed circuit board connectors on the ends thereof, said connectors being connected to said boards whereby the conductors in said cables are electrically connected to said conductors on said boards,
terminal junction modules on the other sides of said boards, one of said boards having opening means thereon whereby all of said modules are accessible from one direction,
said terminal junction modules having first contact terminals therein, said contact terminals in each module having portions extending through the board on which each said modules is mounted and electrically connected to said conductors on said printed circuit boards, and
interconnection conductors having second contact terminals on their ends, said second terminals being selectively mated with said first terminals, thereby to selectively interconnect the conductors of said cables.

7. The apparatus of claim 6 further comprising a junction box in which said circuit boards are mounted, said junction box having receptacles mounted thereon receiving said multi-conductor cables and supporting said circuit boards.

8. The apparatus of claim 7 wherein said receptacles are removably mounted on said junction box.

9. The apparatus of claim 6 wherein the edge portions of said circuit boards are provided with first apertured terminal portions that are electrically connected to said board conductors, and said connectors extend through said apertured terminal portions into engagement therewith.

10. The apparatus of claim 9 wherein each of said connectors comprises a receptacle having a plurality of sockets therein, and wire members electrically connected to said sockets and extending through said first apertured terminal portions into electrical contact therewith, said wire members serving to retain each receptacle on the adjacent circuit board.

11. The apparatus of claim 10 wherein said conductors of said multiconductors cables have terminals on the ends thereof which are received in the sockets of said receptacles.

12. The apparatus of claim 6 wherein groups of said modules are mounted on the other sides of said boards by support brackets which retainably receive said groups of modules therein.

13. The apparatus of claim 12 wherein each of said brackets comprises a generally U-shaped side wall terminating in inwardly extending flanges which engage and retain an adjacent module in said bracket, and wherein a pair of inwardly extending flanges is provided on opposite upper end portions of said side wall, said last-mentioned flanges engaging recessed portions in adjacent modules to retain them within said bracket.

14. The apparatus of claim 6 wherein said opening means in one of said boards are a plurality of openings therein that receive therethrough terminal junction modules mounted on the other of said boards.

15. The apparatus of claim 14 wherein said circuit boards are of substantially identical construction and are arranged in reverse end-to-end relation with respect to each other.

16. The apparatus of claim 6 wherein each of said terminal junction modules comprises a body portion having a plurality of sockets therein, and said second contact terminals on said interconnection conductors comprise contact pins removably receivable within said module sockets.

17. The apparatus of claim 16 wherein each of said module sockets comprises flexible and resilient receptacle means for releasably engaging said contact pins on said interconnection conductors.

18. The apparatus of claim 6 wherein each of said circuit boards comprises apertured terminal portions, and wherein said portions of said first contact terminals are connected to said terminal portions to electrically connect said modules to said conductors on said boards.

* * * * *